United States Patent [19]

Tanaka et al.

[11] Patent Number: 4,655,584
[45] Date of Patent: Apr. 7, 1987

[54] SUBSTRATE POSITIONING APPARATUS

[75] Inventors: Hiroshi Tanaka; Yukio Kakizaki; Hiromitsu Iwata, all of Yokohama; Tsuyoshi Naraki, Tokyo, all of Japan

[73] Assignee: Nippon Kogaku K. K., Tokyo, Japan

[21] Appl. No.: 729,968

[22] Filed: May 3, 1985

[30] Foreign Application Priority Data

May 11, 1984 [JP] Japan .................................. 59-94061
Oct. 25, 1984 [JP] Japan .................................. 59-224953
Nov. 1, 1984 [JP] Japan .................................. 59-230634

[51] Int. Cl.⁴ ........................ G03B 27/42; A23G 9/00
[52] U.S. Cl. ...................................... 355/53; 414/225
[58] Field of Search ................ 118/500, 503; 414/225, 414/217; 355/72, 73, 53

[56] References Cited

U.S. PATENT DOCUMENTS

| | | | |
|---|---|---|---|
| 3,722,996 | 3/1973 | Fox ......................................... | 355/53 |
| 3,930,684 | 1/1976 | Lasch et al. ...................... | 355/73 X |
| 4,345,836 | 8/1982 | Phillips .................................. | 355/53 |
| 4,385,083 | 5/1983 | Shelley ............................ | 118/503 X |
| 4,407,627 | 10/1983 | Sato et al. ............................. | 414/757 |
| 4,483,434 | 11/1984 | Miwa et al. .......................... | 198/394 |
| 4,556,362 | 12/1985 | Bahnck et al. .................. | 414/225 X |

OTHER PUBLICATIONS

IBM Technical Disclosure Bulletin, vol. 14, No. Sep. 1972, "Wafer Centering Fixture".

Primary Examiner—Donald A. Griffin
Attorney, Agent, or Firm—Shapiro and Shapiro

[57] ABSTRACT

An apparatus for positioning a planar substrate on a plane relative to a stage comprises means for supporting the substrate on the plane, the supporting means being provided on the stage for rotation about an axis perpendicular to the plane, first drive means for moving the substrate relative to the supporting means in a predetermined direction along the plane, a reference member disposed on the stage and having a reference surface intersecting the plane, the reference member having a position in which the reference surface is opposed to the substrate moved in the predetermined position so that the reference surface is brought into contact with the circumferential end of the substrate moved by the first drive means to thereby position the substrate, and a biased position in which the reference surface is biased away from the circumferential end of the substrate from the opposed position, and second drive means for displacing the reference member between the opposed position and the biased position.

21 Claims, 9 Drawing Figures

SUBSTRATE POSITIONING APPARATUS

BACKGROUND OF THE INVENTION

1. Field of the Invention

This invention relates to an apparatus for positioning a substrate such as a semiconductor wafer or a photomask, and in particular to a positioning apparatus suitable for an exposure apparatus of which highly accurate positioning is required.

2. Description of the Prior Art

In the manufacture of semiconductor devices such as IC and LSI, there is known an exposure apparatus in which the image of a circuit pattern depicted on a negative called a reticle is reduced and projected onto the photosensitive layer of a semiconductor wafer by a projection lens. The size of the circuit pattern is of the order of 20 mm square at greatest and the diameter of the wafer is of the order of 100 mm–150 mm and therefore, in this apparatus, the transfer of the circuit pattern to the whole surface of the wafer is effected by the so-called step-and-repeat method in which the wafer is placed on a two-dimensionally movable stage and the wafer is caused to step relative to the projected image and then exposed to light.

Usually, to manufacture a semiconductor device, the projected image of a circuit pattern different from a previously transferred circuit pattern is superposedly exposed to light with respect to a wafer. Therefore, it is necessary to correct the two-dimensional alignment and rotational deviation relative to the projected image of the wafer before the superposed exposure is effected. The exposure apparatus of this type has incorporated therein a so-called precise alignment apparatus which detects an alignment mark provided on a wafer by a photoelectric microscope and effects the alignment between the wafer and the projected image. In order to shorten the time required for the searching of the alignment mark by this alignment apparatus, the wafer is roughly positioned by the use of a flat provided in a circumferential portion thereof before it is placed on a stage. This rough positioning is accomplished by a prealignment apparatus. This prealignment apparatus chiefly serves not only to accomplish two-dimensional rough positioning of the wafer, but also to orient the position of the flat of the conveyed wafer always constant relative to the direction of two-dimensional movement of the stage. When the orientation is accomplished, the wafer is conveyed from the prealignment apparatus to the stage so that the direction of the flat thereof does not change, and is held by a vacuum adsorption holder rotatably provided on the stage, whereby precise alignment including the correction of the rotational deviation is accomplished.

SUMMARY OF THE INVENTION

It is an object of the present invention to provide an apparatus which can quickly accomplish precise alignment of a substrate such as a wafer.

It is another object of the present invention to provide an apparatus which can accomplish the positioning of a substrate formed semicircularly by being partly cut away in two directions based on the position of the cut-away without causing any positional deviation of the substrate relative to a holder.

The present invention provides a positioning apparatus provided with a holder for supporting a substrate thereon, a stage for rotatably holding the holder, a reference member for bearing against the end surface of the substrate and positioning the substrate at a predetermined position on the holder, and means for rotating the holder to correct the rotational error of the substrate after the positioning. The holder has such a shape that at least a portion of the circumference of the substrate protrudes from the supporting surface of the holder, and the reference member is provided on the stage for movement between a first position in which it bears against the protruding end surface of the substrate for positioning and a second position in which it is not in contact with the end surface of the substrate for the rotation of the holder.

The present invention further provides an apparatus having first and second reference members one of which is disposed so as to bear against the circumferential end of a semicircular substrate and the other of which is disposed so as to be situated in spaced apart relationship with the cut-away circumference of the substrate, and third and fourth reference members movable relative to the first and second reference members, respectively, so that one of the third and fourth reference members bears against the cut-away circumference of the substrate and the other does not bear against the circumferential end of the substrate.

The positioning of a wafer having a partly cut-away flat is usually effected with respect to two orthogonal directions with the flat as a reference. By the above-described apparatus, the positioning in these two directions is made possible with the center of the wafer and the center of the holder being always coincident with each other.

In an embodiment of the present invention, there are provided two reference members which are movable between a first position and a second position relative to the center of a holder to effect two kinds of positioning of a semicircular substrate, i.e., 0° positioning and 90° positioning, and which are adapted to be alternately changed over between the 0° positioning and the 90° positioning so that when one of the two reference members is in the first position, the other assumes the second position and which are arranged around a supporting table in positional relationship of 90°, and each of the two reference members is provided with a bearing member for bearing against the cut-away at 0° position and another bearing member for bearing against the circumferential end of the substrate at 90° position.

DESCRIPTION OF THE PREFERRED EMBODIMENTS

Figure 1:
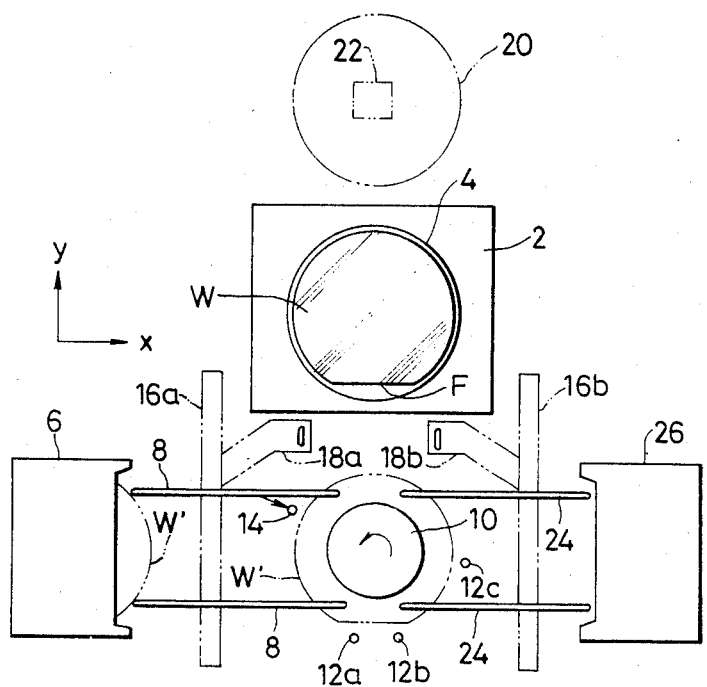
FIG. 1 is a plan view schematically showing the construction of a wafer conveying and wafer prepositioning apparatus for use with an exposure apparatus suitable for an embodiment of the present invention.

Referring to FIG. 1, there is schematically shown the wafer conveying system of a projection exposure apparatus. A wafer W is placed on the holder 4 of a stage 2. A plurality of wafers W' to be exposed are contained in a wafer cassette 6. The wafers W' are successively carried to the turntable 10 of a prealignment apparatus by a belt 8.

Each wafer W' is centered so that the center thereof becomes coincident with the center of rotation of the turntable 10, whereafter is vacuum-adsorbed to the turntable 10. Although not shown, the wafer adsorbed to the turntable is rotated by a motor and the flat around the wafer is photoelectrically detected and the wafer is stopped at such a position in which the flat is opposed to two rollers 12a and 12b. Thereafter, the adsorption by the turntable is released and, when the end surface of the wafer is pressed in the direction of the arrow by a pressing member 14, the flat of the wafer bears against the rollers 12a and 12b and another roller 12c bears against the circumferential end of the wafer, thereby positioning the wafer.

The prealigned wafer is delivered to slider arms 18a and 18b moved at the same time along guides 16a and 16b extending parallel to each other in y direction, and is conveyed to just above the holder 4 of the stage 2. The wafer W delivered onto the holder 4 is re-prealigned by a positioning device which will later be described, in order to correct the prealignment accuracy degraded by the delivering operation. Then, for the exposure operation, the stage 2 steps two-dimensionally relative to the projected image 22 of a reticle by a projection lens 20 and effects repeated exposure of the wafer W. The wafer which has been exposed is again delivered to the turntable 10 at the position of FIG. 1 by the slider arms 18a and 18b, whereafter it is carried into a wafer cassette 26 by a belt 24.

Figure 2:
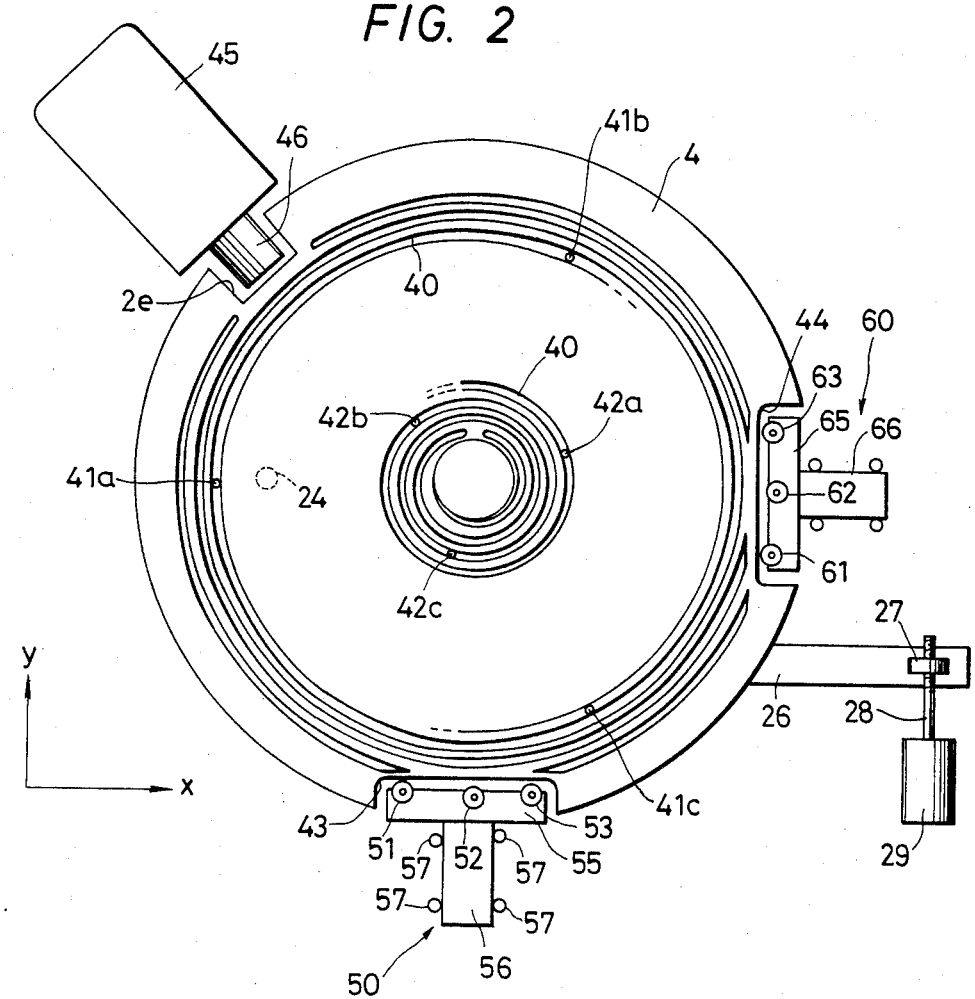
FIG. 2 is a plan view showing the construction of a positioning apparatus according to a first embodiment of the present invention.
Figure 3:
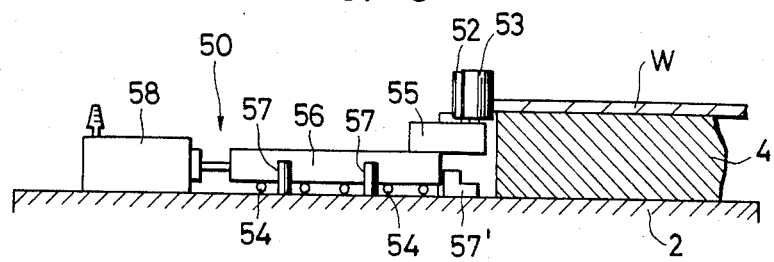
FIG. 3 is a side view of the essential portions of the FIG. 2 apparatus.

A positioning apparatus shown in FIGS. 2 and 3 is provided on the stage 2. A spiral groove 40 is formed in the supporting surface of the circular holder 4 which supports the wafer W thereon. Near the outer periphery of this groove 40, three intake holes 41a, 41b and 41c are provided at substantially equal angular intervals, and the interior of the groove covered with the wafer is evacuated from these intake holes, thereby correcting the wafer to a uniform plane conforming to the supporting surface. Also, near the center of the groove 40, three exhaust holes 42a, 42b and 42c are provided at substantially equal angular intervals and, by a gas being exhausted from these exhaust holes, the peeling-off of the wafer immediately after the vacuum adsorption has been released is improved and also the unnecessary friction caused between the wafer and the supporting surface during the positioning is reduced. Cut-aways 43 and 44 are formed in the circumference of the holder 4 at two locations which are in substantially orthogonal relationship with respect to the center of the holder. One cut-away 43 is situated at a position opposed to the flat F of the wafer on the holder. The size of each cut-away is set so that in each cut-away, the flat F and the circumferential end of the wafer protrude from the supporting surface. The holder 4 is provided for rotation about the rotary shaft 24 of the stage 2. The rotary shaft 24 is provided at a position which is not coincident with the center of the supporting surface of the holder but eccentric with respect thereto. A nut 27 is turnably coupled to an arm 26 fixed to the holder, through a shaft perpendicular to the plane of the drawing sheet, and a motor 29 fixed to the stage 2 is provided on a feed screw 28 threadably engaged with the nut 27 to thereby effect the rotation of the holder about the shaft 24. Reference members 50 and 60 movable relative to the holder in substantially radial directions from the center of the supporting surface are provided in the cut-aways 43 and 44, respectively. The reference member 50, as shown in FIG. 3, is provided on the stage 2 through a linear ball race 54 so as to be accurately movable back and forth in y direction. In this reference member 50, three pillar-like rollers 51, 52 and 53 bearing against the flat or the circumferential end of the wafer are rotatably supported on a plate 55 in such a manner that they are arranged at a predetermined interval in x direction. The plate 55 is fixed to a slider 56, which is guided by the stage 2 through ball race 54 and rollers 57 keeping thir rectilinear movement in y direction. Also, stops 57' for controlling the amount of forward movement of the reference member 50 by an air cylinder 58 are provided at the fore end of the slider 56 (that side opposed to the holder 2). At the forwardly moved position whereat the slider 56 bears against the stops 57', the opposite ones 51 and 53 of the three rollers are arranged parallel to the x-axis and both bear against the flat F of the wafer. The middle rollr 52 is provided at such a position that at this time, it is spaced apart from the flat F. With regard also to the reference member 60, three rollers 61, 62 and 63 of the same shape, like the previously described rollers 51, 52 and 53, are rotatably supported on a plate 65 in such a manner that they are arranged in y direction, and are moved back and fourth in x direction with a slider 66. The arrangement relation between the respective three rollers 51, 52, 53 and 61, 62, 63 of the reference members will now be described. During the 0° re-positioning, the rollers 51 and 53 bear against the flat of the wafer, the circumferential end spaced apart from the flat by about 90° bears against the roller 62, and the other rollers 52, 61, 63 do not contact the end surface of the wafer. On the other hand, during the 90° re-positioning, the rollers 61 and 63 bears against the flat, the circumferential end bears aainst the roller 52, and the other rollers 62, 51, 53 do not contact the end surface of the wafer. By so arranging the rollers, they can be used commonly in the orientation flat in both directions of 0° and 90°. An air cylinder 45 drives a pressing member 46 for pressing the wafer against one set of rollers 51, 53, 62 or the other set of rollers 61, 63, 52.

In such a construction, to effect the re-positioning on the stage, the wafer W is placed on the holder 4 as shown in FIG. 1, whereafter the two reference members 50 and 60 are moved fowardly by an air cylinder 58, and then air and gas such as nitrogen are exhausted from the exhaust holes 42a, 42b and 42c, thereby forming a static pressure air being between the back of the wafer and the supporting surface. Subsequently, the air cylinder 45 is operated to cause the pressing member 46 to press the circumference of the wafer toward the reference members 50 and 60. During the time that this pressing operation continues, the outflow of the gas from the exhaust holes is discontinued and instead, vacuum drawing is effected from the intake holes 41a, 41b and 41c. When this vacuum drawing is completed, the bearing of the pressing member 46 against the end surface of the wafer is released while, at the same time, the operation of the air cylinder 58 is discontinued, whereby the reference members 50 and 60 are retracted from the holder 4.

The thus re-positioned wafer W is carried to just beneath the projection lens 20 by the stage, and the mark on the wafer is observed by means of an alignment device and the two-dimensional position thereof relative to the projected image 22 is prescribed while, at the same time, correction of any rotational deviation is also effected. This correction of the rotational deviation is accomplished by the motor 29 shown in FIG. 2.

Figure 4:
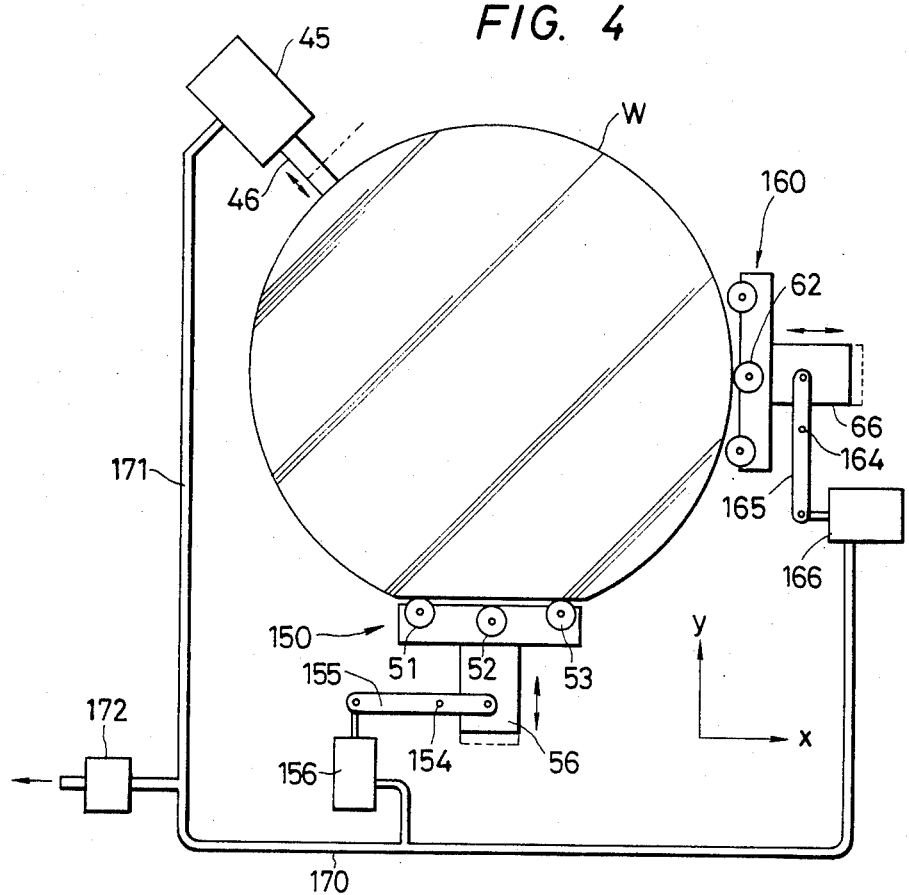
FIG. 4 is a plan view schematically showing the construction of a positioning apparatus according to a second embodiment of the present invention.

A second embodiment of the present invention will now be described by reference to FIG. 4. FIG. 4 shows the state at a point of time whereat the 0° re-positioning of the wafer W on the holder 2 has been completed by reference members and a pressing member. In FIG. 4, members functionally identical to those in FIG. 2 are given identical reference numbers. In this second embodiment, a reference member 150 is rectilinearly moved in y direction by an air cylinder 156 through an arm 155 having a rotatable shaft 154 on the stage. The arm 155 is such that the length from the shaft 154 to the slider 56 is, for example, about one half of the length from the point of coupling between the arm and the air cylinder 156 to the shaft 154, thereby increasing the force of the piston of the air cylinder to 1 or more with respect to the load of the reference member in y direction. Likewise, a reference member 160 is rectilinearly moved in x direction through an arm 165 pivotable about a fulcrum 164 by an air cylinder 166. Since FIG. 4 shows the state of the 0° re-positioning, the two rollers 51 and 53 of the reference member 150 bear against the flat of the wafer and one roller 62 of the reference member 160 bears against the circumferential end of the wafer. Both of the air cylinders 156 and 166 are connected through a common pipe 170 to an electromagnetic valve 172 for switching the supply of the air. A pipe 171 from the air cylinder 45 of the pressing member 46 is further connected to the electromagnetic valve 172, and the three air cylinders 45, 156 and 166 are connected to a common air supply source.

In the above-described construction, when a wafer W is prealigned at 0° and placed on the holder, the electromagnetic valve 172 is opened and air of the same pressure is supplied to the three air cylinders 45, 156 and 166. Before this supply of the air, the piston of each air cylinder is biased by a coil spring, and the pressing member 46, the rollers 51, 53, 62, etc. are retracted from their positions in which they are to re-position the wafer. In FIG. 4, the retracted position of the pressing member 46, the retracted position of the reference member 150 and the retracted position of the reference member 160 are all indicated by broken lines. By the supply of the air from the electromagnetic valve 172, the reference members 150 and 160 are moved from their retracted positions to their forwardly moved positions determined by the stops 57' as shown in FIG. 3. During this movement, the pressing member 46 is also moved toward the center of the wafer. In this manner, the force opposing to the pressing member 46 in the forwardly moved positions of the reference members 150 and 160 is sufficiently provided by the aforedescribed force increasing action of the arms 155 and 165. In the manner as described above, the 0° re-positioning is completed and subsequently, the vacuum adsorption of the holder is started and, at a point of time whereat the adsorption has been completed, the electromagnetic valve 172 is closed. Thus, by the action of the coil springs which bias the pistons in the air cylinders 45, 156 and 166, the pressing member 46 and the reference members 150 and 160 are returned to their respective retracted positions.

In the first and second embodiments of the present invention, a wafer prealignment apparatus used both for the 0° re-positioning has been described and the 90° re-positioning, but even if the present invention is applied to an apparatus having only three rollers 51, 53 and 62 in order to effect only the 0° re-positioning as in the apparatus of the prior art, there may be obtained a similar effect. In this case, only the two rollers 51 and 53 bearing against the flat may be retracted.

Figure 5:
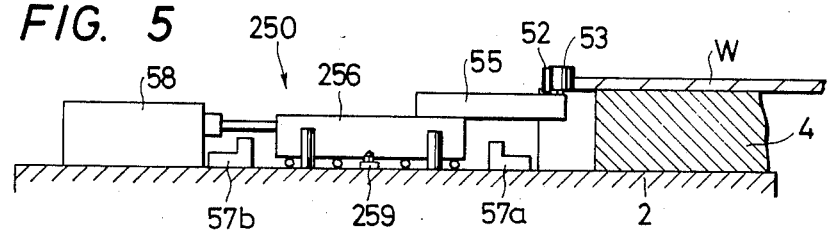
FIG. 5 is a side view of the essential portions of a modification.

In many exposure apparatuses and inspection apparatuses, an alignment mark or a special pattern formed on a wafer is sometimes used to effect more precise positioning of the wafer. In this case, the design is such as to rotate the holder 4 by a minute amount relative to the stage 2 to effect the positioning of the wafer in the direction of rotation. Where the holder 4 is thus rotated to accomplish more precise rotational positioning, after the 0° positioning by the rollers 51, 53 and 62 or the 90° positioning by the rollers 61, 63 and 52 has been completed and the wafer has been vacuum-adsorbed, the two reference members must be moved relative to the rotation of the wafer so as to escape from the circumferential end of the wafer to a position whereat each roller does not bear on the wafer. In this case, it may suffice if the reference members lying at their forwardly moved positions escape to their retracted positions, but originally there is no escape of the reference members lying at their retracted positions. Therefore, as shown in FIG. 5, for example, a click stop 259 is provided so as to restrain the slider 256 of the reference member 250 at three points, i.e., the forwardly moved position, the retracted position and the escape position. FIG. 5 shows a case where the rollers 51, 52 and 53 are in their retracted positions, and the slider 256 is restrained by the click stop 259. In this case, a stop 57a prescribes the forwardly moved positions of the rollers. A stop 57b prescribes the escape position, but it need not be specially provided, because with regard to the escape position, the rollers may simply be allowed to escape. With respect also to the other reference member, a similar construction is adopted.

Figure 6:
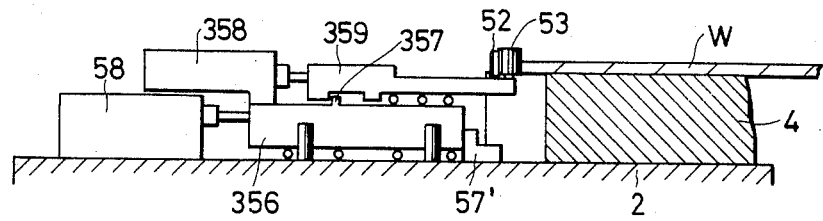
FIG. 6 is a side view of the essential portions of another modification.

FIG. 6 shows another example in which the rollers 51, 52 and 53 are prescribed at their escape positions, and this is a so-called double slider structure. That is, unlike the hitherto described embodiments, a second slider 359 and a drive source 358 are provided on a slider 356, and a roller is fixed to the slider 359. The slider 359 is movable to the left and right on the slider 356 as viewed in FIG. 6, and its stroke is prescribed by a stop 357. In the shown state in which the slider 356 is restrained by the stop 357, the rollers 51, 52 and 53 are prescribed at their forwardly moved positions and retracted positions by the forward and backward movement of the slider 359. When the 0° or 90° positioning is completed, the drive source 58 is operated to move the slider 356 away from the stopper 57. When the slider 359 is in its forwardly moved position as shown in FIG. 6, the drive source 358 may be operated to move only the slider 359 to its retracted position. However, when the slider 359 is in its retracted position at the point of time whereat the 0° or 90° positioning has been completed, it is necessary to operate the drive source 58 without fail and cause the slider 356 to escape away from the stop 57'.

In the embodiments of FIGS. 5 and 6, the holder 4 is designed to rotate relative to the stage 2 and therefore, it is necessary to return the holder 4 to a neutral position of rotation before the wafer W is placed on the holder 4. Also, each roller has been moved away from the center of the holder 4 from its retracted position to its escape position, but a similar effect may be obtained even if the rollers themselves are embedded in the plate 55 or the slider 359.

Figure 7:
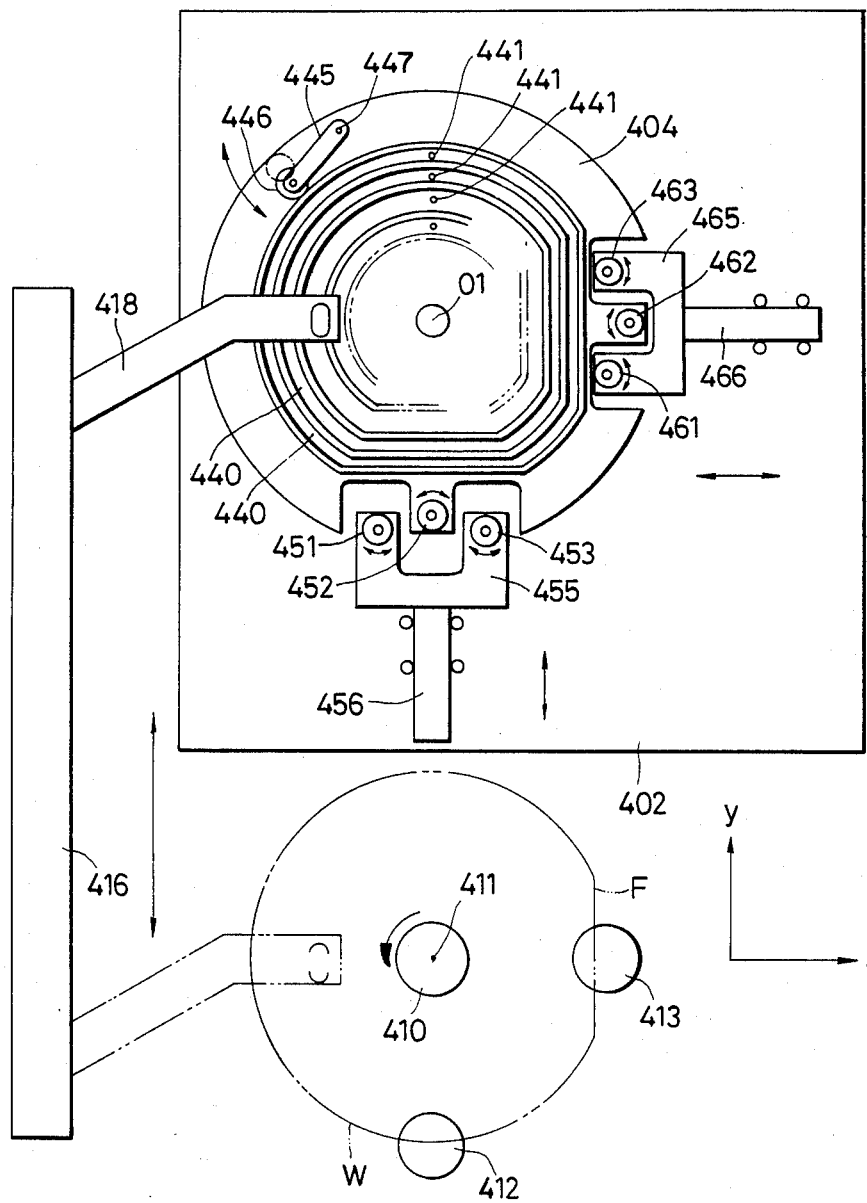
FIG. 7 is a plan view showing the construction of a positioning apparatus according to a third embodiment of the present invention.

Referring now to FIG. 7, there is shown an embodiment in which some of the rollers of each reference member are provided on the wafer holder.

As in FIG. 1, a wafer W centered so that the center of rotation 411 of a turntable 410 and the center of the wafer are coincident with each other is rotated in the direction of the arrow. A photoelectric sensor 412 spaced apart in y direction from the center 411 photoelectrically detects, from any variation in the shape of the marginal portion of the rotating wafer, that the flat F of the wafer has become substantially parallel to the x-axis. Also, a photoelectric sensor 413 spaced apart in x direction from the center 411 likewise photoelectrically detects that the first flat F has become substantially parallel to the y-axis.

The wafer W whose flat F has been roughly positioned on the turntable is delivered onto a holder 404 by a slide arm 418 moved along a guide 416 in y direction. Annular grooves 440 are concentrically formed in the holder 404. The outside diameter of the outermost groove is of the same dimension as the outside diameter of the wafer, and the shapes of the grooves at two locations rotated by 90° relative to each other which correspond to the flat F of the wafer are in the form of straight lines. An intake hole 441 is formed in each groove. Rollers 452 and 462 positioned at the centers, respectively, are both rotatably supported on the holder 404 and the distances from the center 01 to the outer peripheral surfaces of these rollers are equal to the radius of the wafer. Accordingly, wher the wafer W is a complete circle, when the wafer is rotated on the holder 404 with the circumferential end of the wafer bearing against the two rollers 452 and 462, the wafer can be rotated with the center thereof being accurately coincident with the center 01 of the adsorbing surface. Rollers 451 and 453 on the opposite sides are rotatably supported on a plate 455 which is fixed to a slider 456 movable on the stage in y direction. Two rollers 461 and 463 are likewise disposed on the opposite sides of the roller 462 in spaced apart relationship with each other in y direction. These rollers 461 and 463 are supported on a plate 465 which is fixed to a slider 466 movable back and forth only in x direction. During the 90° positioning, as shown in FIG. 7, the rollers 461 and 463 are in their forwardly moved positions and the rollers 451 and 453 are in their retracted positions. During the 0° positioning, the rollers are complementarily moved by a drive source similar to that of FIGS. 1 and 3 so that the rollers 461 and 463 are in their retracted positions and the rollers 451 and 43 are in their forwardly moved positions. If the sliders 456 and 466 are coupled together by a mechanical link mechanism, the rollers can be complementarily moved by a single drive source. A pivotable member 445 is supported on the holder 404 for rotation about a shaft 447, and a roller 446 for pressing the circumferential end of the wafer is supported on the fore end thereof. The position in which the roller 446 bears against the wafer is determined so that both of the 0° positioning and the 90° positioning are possible. That is, the pivotable member 445 is provided at a position rotated by 45° about the center 01 relative to both of the segment passing through the roller 452 and the center 01 and the segment passing through the roller 462 and the center 01. This pivotable member 445 is rotated counterclockwise to press the circumference of the wafer after the wafer has been placed on the holder. The operation of rotating the pivotable member is accomplished by a drive source such as a motor or an air cylinder, not shown.

Figure 8:
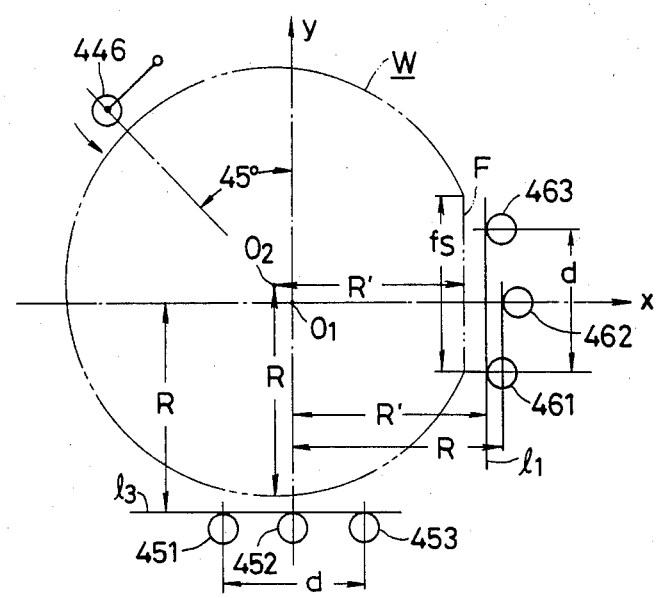
FIG. 8 is a plan view illustrating the 90° positioning operation.
Figure 9:
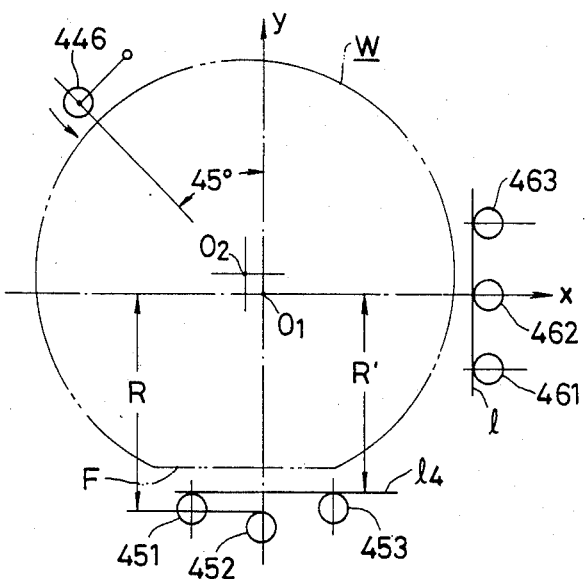
FIG. 9 is a plan view illustrating the 0° positioning operation.

Reference is now had to FIGS. 8 and 9 to describe the operation of the present embodiment. FIG. 8 shows the arrangement of the rollers during the 90° positioning. The slider 466 is forwardly moved toward the center 01 and the slider 456 is retracted. When the radius of the wafer is R and the length of the perpendicular from the center 02 of the wafer to the flat F is R' (R'<R) and the center 01 of the holder is defined as the origin of the xy coordinates, the point at which the roller 452 bears against the wafer lies on the y-axis spaced apart by R from the center 01 and the point at which the roller 462 bears against the wafer lies on the x-axis spaced apart by R from the center 01. A segment $l_1$ passing through the points at which the two rollers 461 and 463 bear against the flat F is parallel to the y-axis and spaced apart by R' from the y-axis. Also, the spacing d in y direction between the bearing points of the rollers 461 and 463 is shorter than the length fs of the flat F of the wafer. The rollers 461 and 463 are situated equidistantly from the roller 462.

On the other hand, the two rollers 451 and 453 which are in their retracted positions are at the same position as the roller 452 with respect to y direction. That is, when a segment passing through the point at which the roller 452 bears against the wafer and parallel to the x-axis is $l_3$, the bearing points of the two rollers 451 and 453 are both positioned on the segment $l_3$.

The spacing between the rollers 451 and 453 also is d.

The wafer W roughly positioned at 90° is placed on the holder by the slide arm 416 so that, as shown in FIG. 8, the center 02 of the wafer is slightly eccentric relative to the center 01 toward the roller 446 side.

Subsequently, the pivotable member 445 is pivoted counter-clockwise and the wafer is pressed in the oblique direction of 45° relative to x direction and y direction by the roller 446. Thus, the flat F of the wafer bears against the two rollers 461 and 463, and the circumferential end spaced apart clockwise by 90° from the flat F bears against the roller 452, whereby precise 90° positioning of the wafer is accomplished. While the roller 446 is pressing the wafer with a predetermined force, exhaust is effected from the intake hole 441 of the holder and vacuum adsorption of the wafer is started. Whether the wafer has been reliably adsorbed is detected by a vacuum sensor, not shown, and when it is judged that the wafer has been adsorbed, the pressing of the roller 446 is released.

On the other hand, in the case of the 0° positioning, as shown in FIG. 9, the rollers 451 and 453 are forwardly moved in y direction toward the center 01 and the rollers 461 and 463 are retracted in x direction until they are aligned with the roller 462 on a straight line. Further, the forwardly moved positions of the rollers 451 and 453 are determined so that a segment $l_4$ passing through the points at which these rollers bear against the wafer and parallel to the x-axis are spaced apart by R' from the x-axis. As in the case shown in FIG. 8, the wafer is placed on the holder with the center 02 thereof being deviated from the center 01, whereafter the wafer is pressed by the roller 446, whereby the flat F bears against the two rollers 451 and 453 and the circumferential end spaced apart counter-clockwise by 90° from the flat F bears against the roller 462 and thus, precise 0° positioning is accomplished.

In many exposure apparatuses and other alignment apparatuses, the wafer is sometimes rotated on the stage by a minute amount to effect more precise positioning. This is accomplished by rotating the holder relative to the stage. In the present embodiment, the rollers 451, 453 and the rollers 461, 463 are provided not on the holder but on the stage and therefore, when the holder which has adsorbed the wafer is slightly rotated, it is necessary to retract at least the rollers bearing against the flat F.

Also, in the above-described embodiment, the rollers 452 and 462 are disposed on the y-axis and the x-axis, respectively, but this is not always necessary. A similar effect may be obtained wherever on the circumference of the radius R from the center 01 they are disposed.

We claim:

1. An apparatus for positioning on a plane a disc having a flat portion in the outer periphery thereof, comprising:
   (a) means for supporting said disc on said plane;
   (b) first reference means disposed in opposed relationship with said flat portion of said disc supported by said supporting means in a first position in which said flat portion faces in a first direction;
   (c) second reference means disposed in opposed relationship with said flat portion of said disc supported by said supporting means in a second position in which said flat portion faces in a second direction rotated by a predetermined angle relative to said first position;
   (d) each of said first and second reference means having a first contact portion for contacting said flat portion and a second contact portion for contacting the circumference of said disc; and
   (e) means for determining the positions of said first and second reference means so that the first contact portion of said first reference means is brought into coincidence with said flat portion and the second contact portion of said second reference means is brought into coincidence with said circumference when said disc is in said first position with the center of said disc and the center of said supporting means being coincident with each other and for determining the positions of said first and second reference means so that the second contact portion of said first reference means is brought into coincidence with said circumference and the first contact portion of said second reference means is brought into coincidence with said flat portion when said disc is in said second position with said centers being coincident with each other.

2. An apparatus according to claim 1, wherein said position determining means includes means for moving said first and second reference means in a direction parallel to said plane while interlocking said first and second reference means with each other.

3. An apparatus according to claim 2, wherein said first and second reference means are moved radially of said disc.

4. An apparatus according to claim 1, further comprising means for contacting the outer periphery of said disc opposed to said first and second reference means to press said disc along said plane.

5. An apparatus according to claim 1, further comprising stage means and wherein said supporting means is provided on said stage means rotatably about an axis perpendicular to said plane and said first and second reference means are provided on said stage means movably relative to said supporting means.

6. An apparatus for positioning on a plane a disc having a flat portion in the outer periphery thereof, comprising:
   (a) means for supporting said disc on said plane;
   (b) first reference means for contacting the outer periphery of said disc disposed on said supporting means lying at a distance substantially equal to the radius of said disc from the center of said supporting means in opposed relationship with said flat portion of said disc supported by said supporting means in a first position in which said flat portion faces in a first direction;
   (c) second reference means for contacting the outer periphery of said disc disposed on said supporting means lying at a distance substantially equal to said radius of the disc from the center of said supporting means in opposed relationship with the circumference of said disc spaced apart by a predetermined angle in the direction of the outer periphery from said flat portion of said disc supported in said first position;
   (d) third reference means for contacting the outer periphery of said disc provided near said first reference means for movement radially of said disc along said plane;
   (e) fourth reference means for contacting the outer periphery of said disc provided near said second reference means for movement radially of said disc along said plane; and
   (f) drive means having a first driving state for moving said third reference means to a position corresponding to said flat portion of said disc which is in said first position and moving said fourth reference means outwardly from the center of said supporting means beyond the radius of said disc, and a second driving state for moving said fourth reference means to a position corresponding to said flat portion of said disc which is in a second position and moving said third reference means outwardly from the center of said supporting means beyond the radius of said disc.

7. An apparatus according to claim 6, further comprising means for contacting the outer periphery of said disc opposed to said reference means to press said disc along said plane.

8. An apparatus according to claim 6, further comprising stage means, and wherein said supporting means is provided on said stage means rotatably about an axis perpendicular to said plane, said first and second reference means are provided on said supporting means, and said third and fourth reference means are provided on said stage means movably relative to said supporting means.

9. An apparatus according to claim 8, wherein said supporting means has a disc-supporting surface that has at its periphery a cut-away portion at each of said first and second positions, the size of each cutaway portion being such that when said disc is supported on said supporting surface at predetermined positions at least part of said flat portion protrudes from said supporting surface into one or the other of said cut-away portions.

10. An apparatus according to claim 9, wherein said cut-away portions are bifurcated and are disposed symmetrically with respect to said first and second reference means, respectively.

11. An apparatus according to claim 6, wherein said first and second reference means comprise first and second disc-contacting elements, respectively, mounted on said supporting means, and wherein each of said third and fourth reference means comprises a pair of disc-contacting elements disposed symmetrically relative to said first and second disc-contacting elements, respectively, said drive means being constructed to move said pairs of disc-contacting elements relative to the center of said supporting means between positions that are beyond the radius of said disc and positions that are within the radius of said disc.

12. An apparatus for positioning at a predetermined position on a plane a disc having a flat portion in the outer periphery thereof, comprising:
stage means;
a holder means disposed on said stage means rotatably about an axis perpendicular to said plane and provided with a supporting surface for supporting said disc on said plane;
said supporting surface having at its periphery at least one cut-away portion whose size is such that when said disc is positioned at said predetermined position at least part of said flat portion protrudes from said supporting surface into said cut-away portion;
a reference member disposed on said stage means to determine a position of the flat portion of said disc;
first drive means for displacing said reference member relative to said holder member between a reference position where said reference member is in contact with said flat portion within said cut-away portion and a position where said reference member is retracted from said reference position; and
second drive means for moving said disc along said plane toward said reference member.

13. An apparatus according to claim 12, wherein said first drive means displaces said reference member radially of said disc to retract said reference member from said reference position.

14. An apparatus according to claim 12, wherein said cut-away portion is one of first and second cutaway portions angularly distant from each other by 90° about a center of said supporting surface, and said reference member is one of first and second reference members for determining the position of said flat portion at said cut-away portions, respectively.

15. An apparatus according to claim 12, further comprising means for controlling said first and second drive means to move said disc while said reference member is located at said reference position.

16. An apparatus according to claim 12, further comprising means for rotating said holder member and means for controlling said first and second drive means to move said disc while said reference member is located at said reference position and for controlling said rotating means and said first drive means to rotate said holder member while said reference member is located at said retracted position.

17. An apparatus for positioning on a plane a disc having a flat portion in the outer periphery thereof, comprising:
(a) means for supporting said disc on said plane;
(b) first reference means disposed in opposed relationship with said flat portion of said disc supported by said supporting means in a first position in which said flat portion faces in a first direction;
(c) second reference means disposed in opposed relationship with said flat portion of said disc supported by said supporting means in a second position in which said flat portion faces in a second direction rotated by a right angle relative to said first position;
(d) each of said first and second reference means having a contact portion for contacting said flat portion of said disc; and
(e) means for determining the positions of said first and second reference means so that the contact portion of said first reference means is brought into coincidence with said flat portion when said disc is in said first position and for determining the positions of said first and second reference means so that the contact portion of said second reference means is brought into coincidence with said flat portion when said disc is in said second position.

18. An apparatus according to claim 17, wherein said position determining means includes means for moving said first and second reference means in a direction parallel to said plane while interlocking said first and second reference means with each other.

19. An apparatus according to claim 18, wherein said first and second reference means are moved radially of said disc.

20. An apparatus according to claim 17, further comprising means for contacting the outer periphery of said disc opposed to said first and second reference means to press said disc along said plane.

21. An apparatus according to claim 17, further comprising stage means and wherein said supporting means is provided on said stage means rotatably about an axis perpendicular to said plane and said first and second reference means are provided on said stage means movably relative to said supporting means.

* * * * *